US007749134B2

(12) United States Patent
Wetzel et al.

(10) Patent No.: US 7,749,134 B2
(45) Date of Patent: Jul. 6, 2010

(54) CONTROL MODULE

(75) Inventors: Gerhard Wetzel, Korntal-Muenchingen (DE); Peter Sprafke, Stuttgart (DE); Martin Gerhaeusser, Cleebronn (DE)

(73) Assignee: Robert Bosch GmbH, Stuttgart (DE)

( * ) Notice: Subject to any disclaimer, the term of this patent is extended or adjusted under 35 U.S.C. 154(b) by 432 days.

(21) Appl. No.: 11/793,838

(22) PCT Filed: Aug. 26, 2005

(86) PCT No.: PCT/EP2005/054210

§ 371 (c)(1),
(2), (4) Date: Nov. 14, 2007

(87) PCT Pub. No.: WO2006/066983

PCT Pub. Date: Jun. 29, 2006

(65) Prior Publication Data

US 2008/0108478 A1     May 8, 2008

(30) Foreign Application Priority Data

Dec. 22, 2004 (DE) .................. 10 2004 061 818

(51) Int. Cl.
*H05K 1/00* (2006.01)
(52) U.S. Cl. .................. 477/34; 361/749; 361/752
(58) Field of Classification Search .......... 361/748, 361/749, 752; 477/34, 36
See application file for complete search history.

(56) References Cited

U.S. PATENT DOCUMENTS

| 4,641,840 | A | * | 2/1987 | Larson ................. 463/22 |
| 4,736,266 | A | * | 4/1988 | Tanibe ................. 361/816 |
| 4,894,663 | A | * | 1/1990 | Urbish et al. ............ 343/702 |
| 5,179,491 | A | * | 1/1993 | Runyan ................. 361/45 |
| 5,285,010 | A |   | 2/1994 | Huber et al. |
| 6,021,368 | A | * | 2/2000 | Taniguchi et al. ........... 701/51 |
| 6,570,773 | B1 |  | 5/2003 | Loibl et al. |
| 2004/0004818 | A1 | | 1/2004 | Kawakita et al. |

FOREIGN PATENT DOCUMENTS

| DE | 4437664 | 4/1996 |
| DE | 19640466 | 4/1998 |

* cited by examiner

*Primary Examiner*—Ha D. Ho
(74) *Attorney, Agent, or Firm*—Kenyon & Kenyon LLP

(57) ABSTRACT

A control module, in particular for a transmission of a motor vehicle, has a substrate part, a control unit situated on a substrate part, which has a first housing part and a second housing part and a housing interior situated between the first housing part and the second housing part, in which an electronic circuit component attached to the first housing part is situated, and has at least one flexible printed circuit foil for electrically connecting the circuit component to electric components situated outside the housing interior on the substrate part, the first housing part of the control unit being situated flat on a contact area of the substrate part and the second housing part being situated within the contact area on the first housing part.

10 Claims, 7 Drawing Sheets

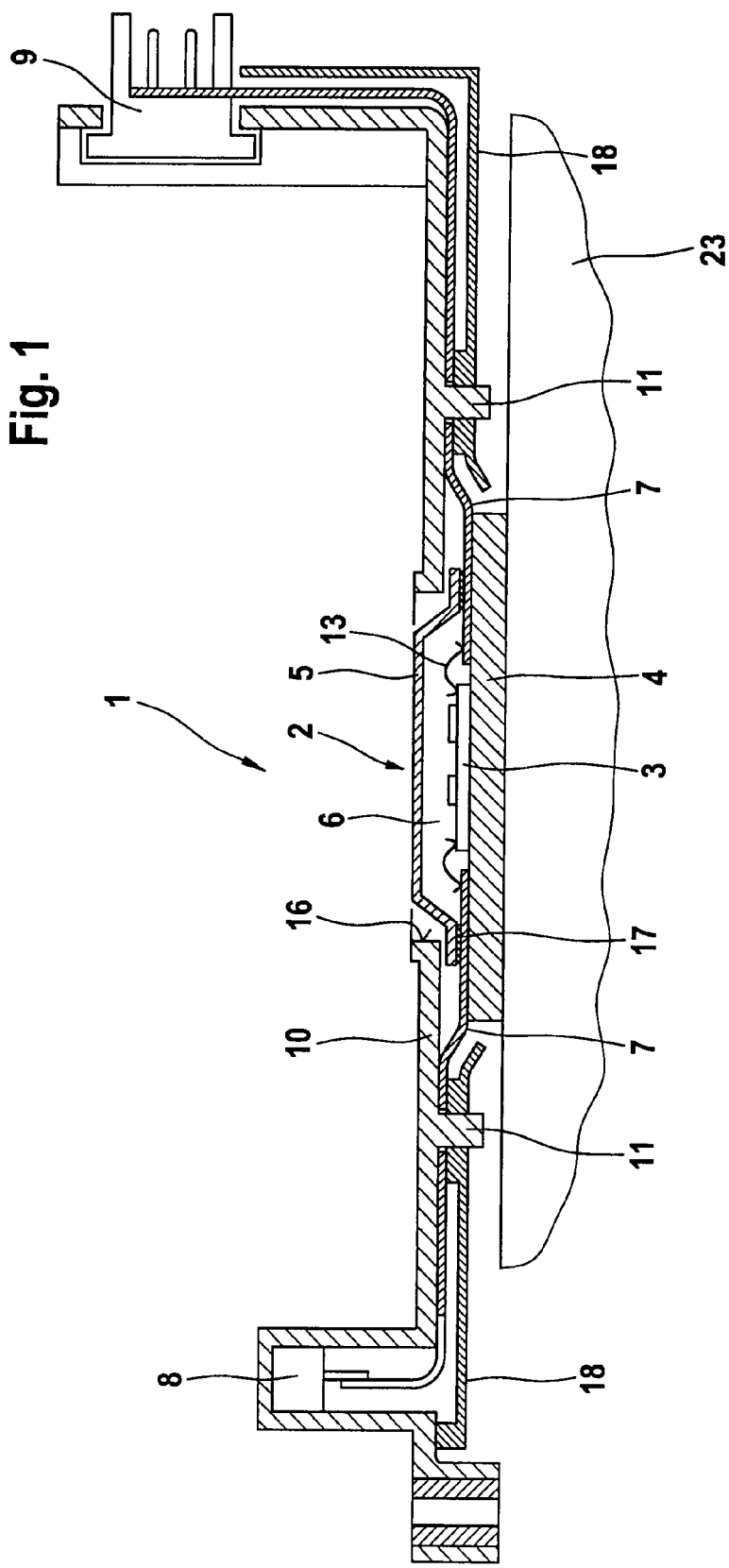

CONTROL MODULE

FIELD OF THE INVENTION

The present invention relates to a control module.

BACKGROUND INFORMATION

In the automobile industry, control modules are used which have a substrate part installable in the motor vehicle, on which different components such as components associated with a motor vehicle component such as the transmission or the engine are situated. For example, sensors, plug connectors, actuators, and a control unit housing provided with an electronic circuit component may be installed on the substrate part. Known control modules to be installed on the transmission of a motor vehicle have, for example, an injection molded plastic substrate part. The different electric components are electrically connected via pressed screen parts which are partially injection coated with plastic. The control unit is connected to the pressed screen parts via connector pins. If the control module is situated in the transmission, the control unit must be reliably sealed to prevent damage to the circuit component by penetrating transmission oil. German Patent Publication No. DE 196 40 466, for example, describes a control unit sealed in this way.

Furthermore, German Patent Publication No. DE 44 37 664 describes a control module for an engine controller in which a flexible printed circuit foil (FPC, Flexible Printed Circuit) is used for connecting the control unit to the electric components situated on the substrate part. Flexible printed circuit foils have the advantage that they are relatively easily adaptable to the conditions of installation. Flexible printed circuit foils have a substrate foil strip made of polyimide, for example, which carries a conductor layer of copper, for example. The track conductors are structured in a photo process and formed by an etching process. The track conductors are insulated outward via a protective coating applied to the substrate foil strip or another insulating foil.

SUMMARY OF THE INVENTION

The control module according to the present invention makes it possible to reduce the manufacturing complexity and costs of the control module. A first housing part of the housing of the control unit is advantageously situated on the substrate part, and the second housing part is situated flat on the first housing part within the contact area, which makes a very compact construction possible. The control unit is preferably attached to the transmission only via the substrate part and the first housing part. This ensures that the seal designed as an adhesive bond between the second housing part and the printed circuit foil is outside the flow of attachment force, so that deformations, vibrations, etc., acting upon the substrate part have no damaging effect on the seal. The outside of the first housing part provided with the circuit component faces away from the substrate part and may be installed on a component of the transmission as a heat sink, for example. The components situated on the substrate part are electrically contacted with the control unit via at least one flexible printed circuit foil, which is attachable to different contact points of the substrate part. It is possible in particular to install the control unit fully assembled on the substrate part and then establish the contacts with the aid of printed circuit foils. Due to the modular design, all components situated on the substrate part of the control module, including the control unit, may be advantageously replaced with components having approximately the same external design but different specifications.

A particularly compact design is made possible due to the fact that the second housing part protrudes into a recess of the substrate part. The first housing part is brought into direct thermal contact with the transmission via fastening elements in the substrate part, preferably threaded bushings. The height of the substrate part is thus considerably reduced overall, and the first housing part used as a heat sink may be advantageously situated on the transmission.

A vibration-free assembly of the printed circuit foil connected to the control unit is achieved by situating the printed circuit foil on projections of the substrate part.

It is particularly advantageous if a plurality of flexible printed circuit foils is provided, at least two electric components of the substrate part being electrically connected to the circuit component each with the aid of a separate flexible printed circuit foil. If only one printed circuit foil is used for contacting all components, it is advisable if this printed circuit foil surrounds the circuit component over a large surface, which may be achieved, for example, by providing the printed circuit foil with a cutout at the place provided for the electronic circuit component. By using a plurality of printed circuit foil strips, the different components may be electrically connected to the circuit component in a controlled manner without having to punch out pieces from the relatively expensive printed circuit foil.

It is, however, also possible to connect, outside the interior of the housing, the at least one printed circuit foil to electrical connecting elements which enter the interior of the housing between the first housing part and the second housing part and are connected there, at least indirectly, to the circuit component. In this case, the printed circuit foil may be connected to the connecting elements after the manufacture of the sealed control unit. The connecting elements may form another printed circuit foil via the track conductors.

When a plurality of printed circuit foil strips is used, these provide different adhesive gap heights, resulting in strict requirements for the sealing function. Therefore, it is advantageous in particular to design the printed circuit foil in the area of the circuit component and the seal surrounding this area as one piece to achieve a constant adhesive gap height and to contact the printed circuit foil strips outside the housing. This also provides the option of designing the control unit as a small module which is easy to handle during assembly and of connecting flexible printed circuit foil strips prefabricated with components to the control unit. Different variants may also be rendered in a simple manner by exchanging the printed circuit foils.

The at least one flexible printed circuit foil may also advantageously enter the interior of the housing of the control unit between the first housing part and the second housing part and be electrically connected there, at least indirectly, to the circuit component.

BRIEF DESCRIPTION OF THE DRAWINGS

Exemplary embodiments of the present invention are illustrated in the drawing and explained in detail in the description that follows.

FIG. 1 shows a cross section through a first exemplary embodiment of a control module according to the present invention.

DETAILED DESCRIPTION

Figure 3:
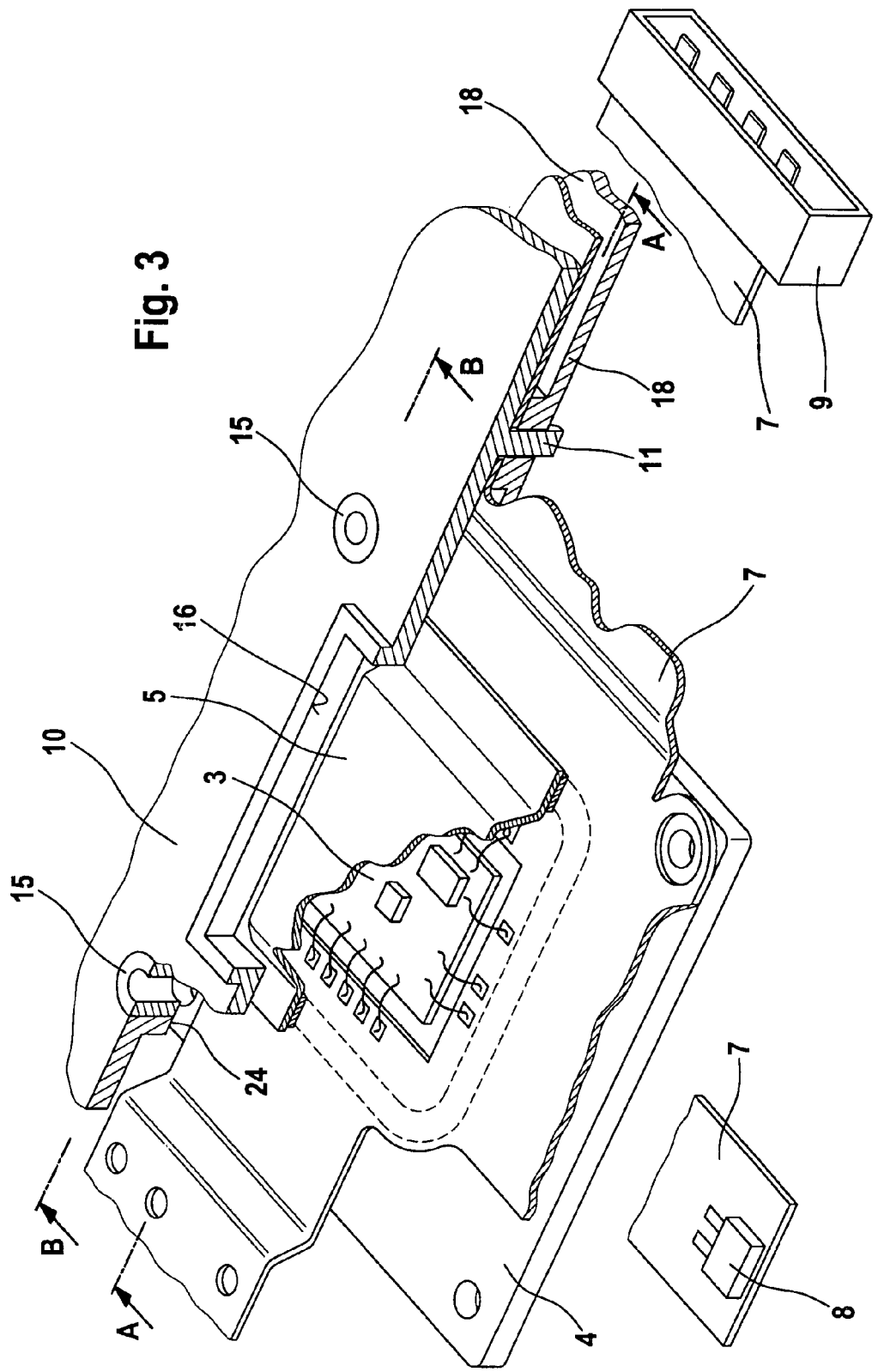
FIG. 3 shows a perspective detail of the first exemplary embodiment of a control module according to the present invention.

FIG. 1 and FIG. 3 show a first exemplary embodiment of a control module according to the present invention. Control module 1 includes a substrate part 10 made of metal or plastic, which is attachable to the transmission of a motor vehicle. The substrate part is plate-shaped, for example, having protruding webs and projections. Electric components such as, for example, connector parts 9, sensors 8, hydraulic valves (not shown) for triggering actuators of a transmission, and a transmission control unit 2 are situated on the substrate part.

Control unit 2 has a first housing part 4, which is preferably designed as a metallic bottom part made of aluminum, for example, and a second housing part 5, which is preferably designed as a metallic top part made of aluminum, for example. However, the housing parts may also be manufactured of another material. In particular, second housing part 5 may be manufactured as a plastic part. First housing part 4 and second housing part 5 have a housing interior 6. An electronic circuit component 3, for example, a hybrid circuit situated on a ceramic substrate, is applied to first housing part 4 within housing interior 6. Circuit component 3 may be glued or soldered onto first housing part 4, for example, and is connected to a flexible printed circuit foil 7, having a plurality of track conductors, via bond wires 13. Circuit component 3 may be covered by a gel. Printed circuit foil 7 is provided with a recess, which is quadrangular for example, and within which circuit component 3 is situated. Printed circuit foil 7 is led out of interior 6 of the housing sealed between first housing part 4 and second housing part 5 and may be sealingly glued onto first housing part 5 for example. A seal 17 is provided in the area of contact of first housing part 4 and second housing part 5 for sealing control unit 2. Seal 17 may include a tacky adhesive foil made of an acrylic glue or a liquid adhesive for example, on both sides. The adhesive foil may be applied to printed circuit foil 7 or second housing part 5 by pressing or dispensing. Seal 17 may also be designed as an elastomer seal. As known, an additional mechanical attachment of the second housing part to the first housing part is required here for applying the necessary prestress for the elastomer and for securing second housing part 5.

Figure 2A:
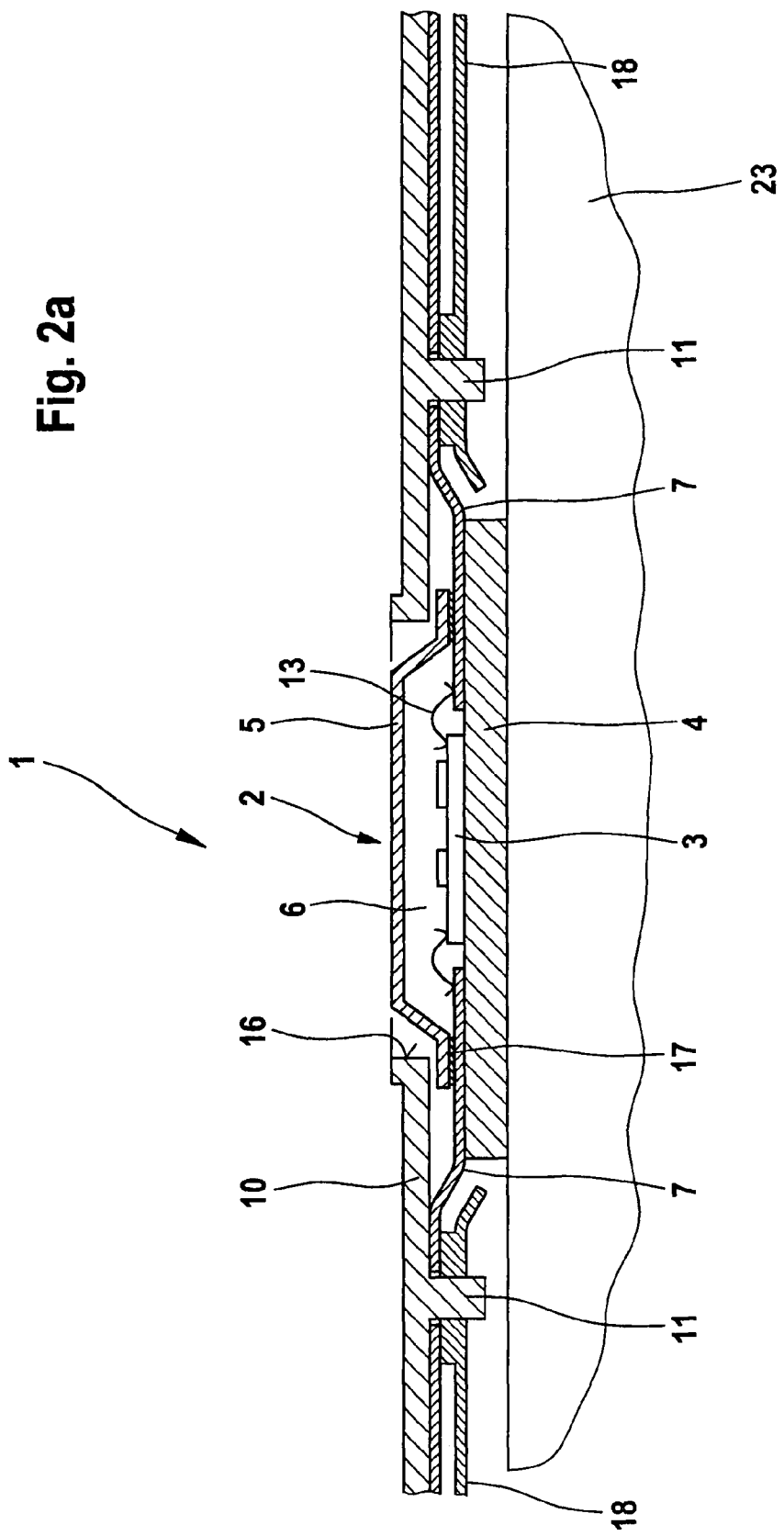
FIG. 2a shows a cross section through the exemplary embodiment of a control module according to the present invention of FIG. 3 along line A-A.
Figure 2B:
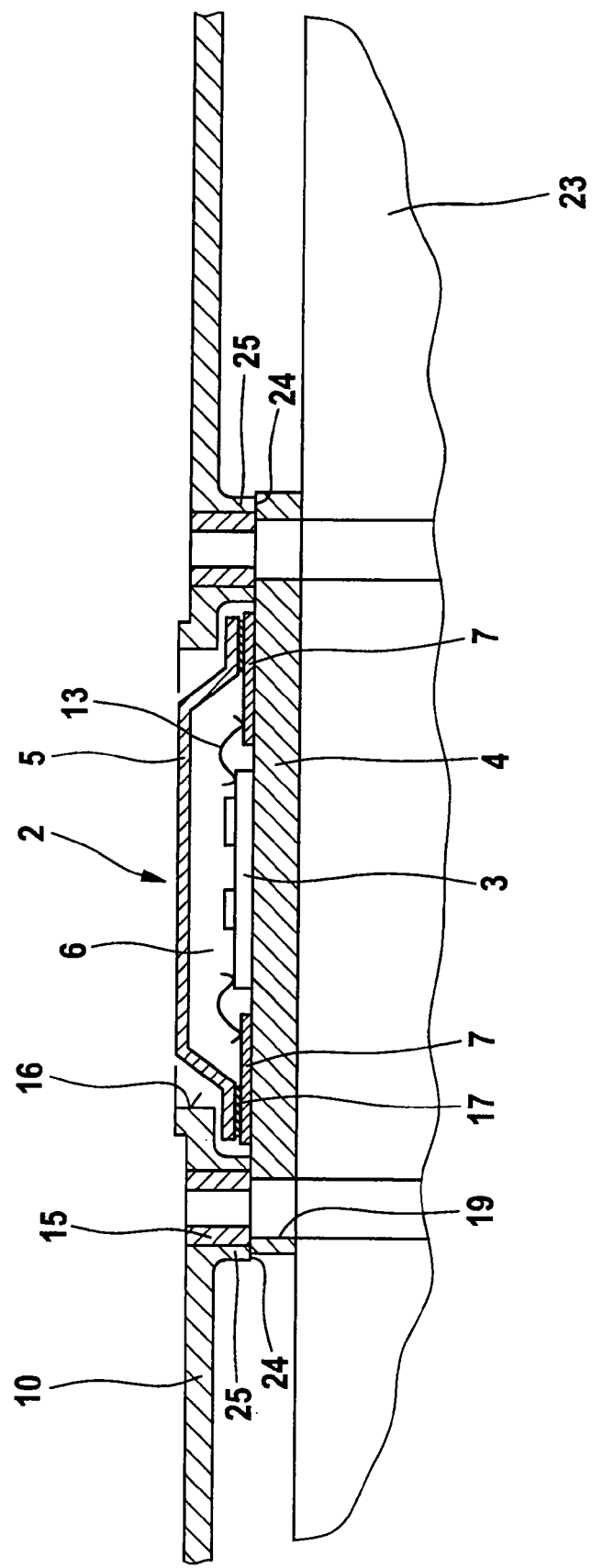
FIG. 2b shows a cross section through the exemplary embodiment of a control module according to the present invention of FIG. 3 along line B-B.

To receive the control unit, the plate-shaped central section of substrate part 10 has a through recess 16, which may have a rectangular shape, for example. As FIGS. 2b and 3 show, housing part 4 of control unit 2 is situated on substrate part 10, the side of first housing part 4 facing the substrate part being in contact with a contact area 24 of the substrate part. Contact area 24 of substrate part 10 may be formed, for example, by two embossed surfaces on projections 25, which are formed on two opposite sides of recess 16. Contact area 24 may also be formed by a circumferential embossed surface or by a plurality of projections. As FIG. 2b shows, due to projections 25 protruding from the side of substrate part 10 facing the first housing part, there is a distance between the side of first housing part 4 facing the substrate part and the side of the substrate part facing first housing part 10, which provides room for the installation of second housing part 5, which is situated within contact area 24, i.e., between the two projections 25, on the substrate part. In the surroundings of recess 16, in contact area 24, fastening elements 15 allowing substrate part 10 and first housing part 4 to be attached to a heat-conducting housing part 23 of the transmission are integrated into substrate part 10, for example, by screwing screws (not shown) into fastening elements 15 of substrate part 10 through bore holes 19 in first housing part 4. As FIGS. 2a and 2b show, control unit 2 is connected to substrate part 10 via fastening elements 15 in such a way that no holding forces act upon second housing part 5. Printed circuit foil 7 protruding from the control unit is positioned on different projections 11 of substrate part 10 and secured by a cover 18 situated on the substrate part. Cover 18 may be formed by a plate-shaped part made of plastic or metal, for example, which is attachable to the substrate part essentially parallel thereto. For this purpose, cover 18 may be placed onto projections 11 of the substrate part, for example. The ends of printed circuit foil 7 facing away from control unit 2 are electrically connected to connector part 9, sensors 8 and, optionally, other components situated on substrate part 10, which may be accomplished by welding or soldering, for example. Furthermore, as FIGS. 1, 2a, and 2b show, the external side of first housing part 4 facing away from second housing part 5 is freely accessible at the bottom of substrate part 10 and, for example, may be immersed directly into the transmission oil or may be placed onto a heat-dissipating housing part of the transmission, which is advantageous in particular because first housing part 4 is provided as a heat sink for electronic circuit component 3 glued thereto.

Figure 4:
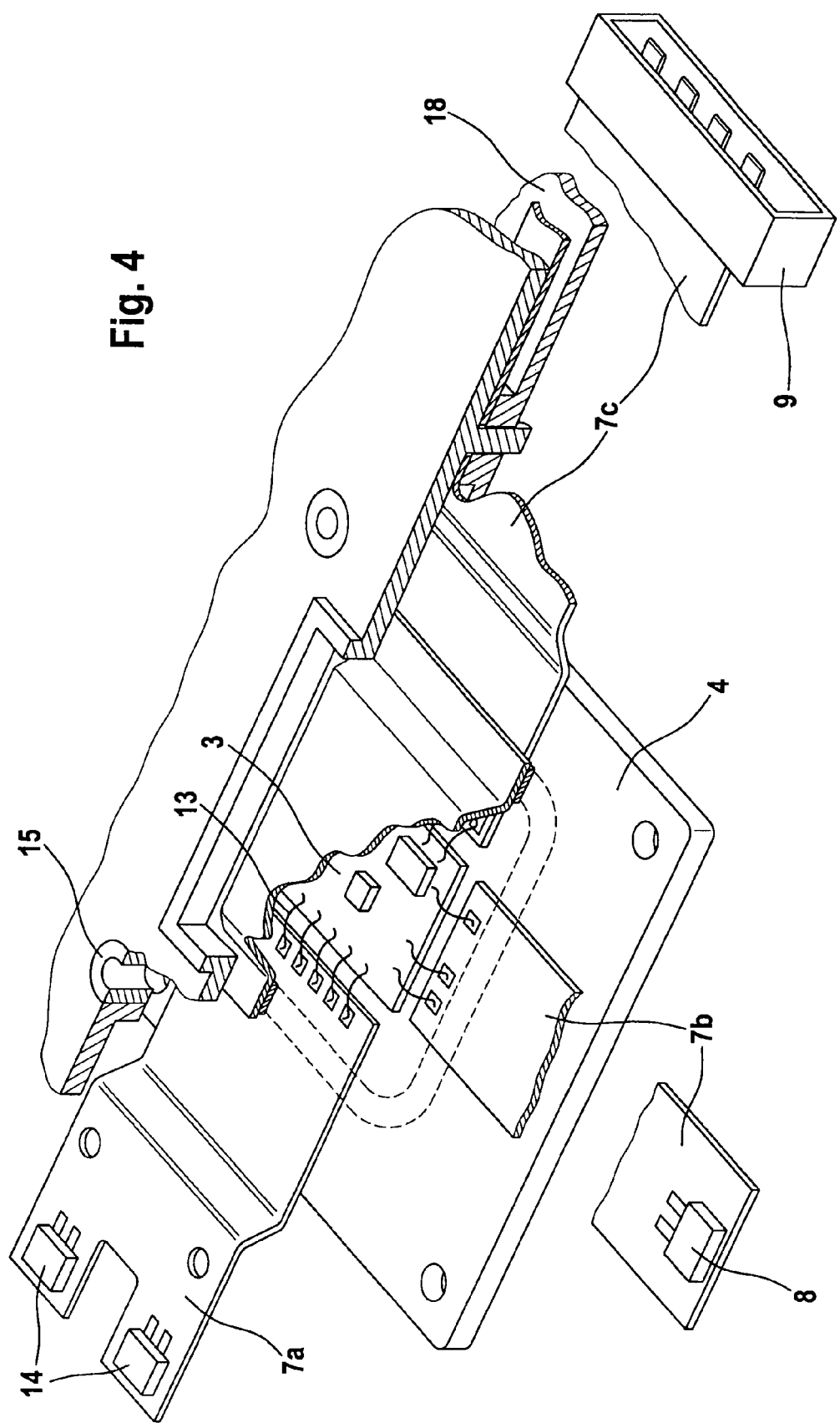
FIG. 4 shows a perspective detail of a second exemplary embodiment of a control module according to the present invention.
Figure 5:
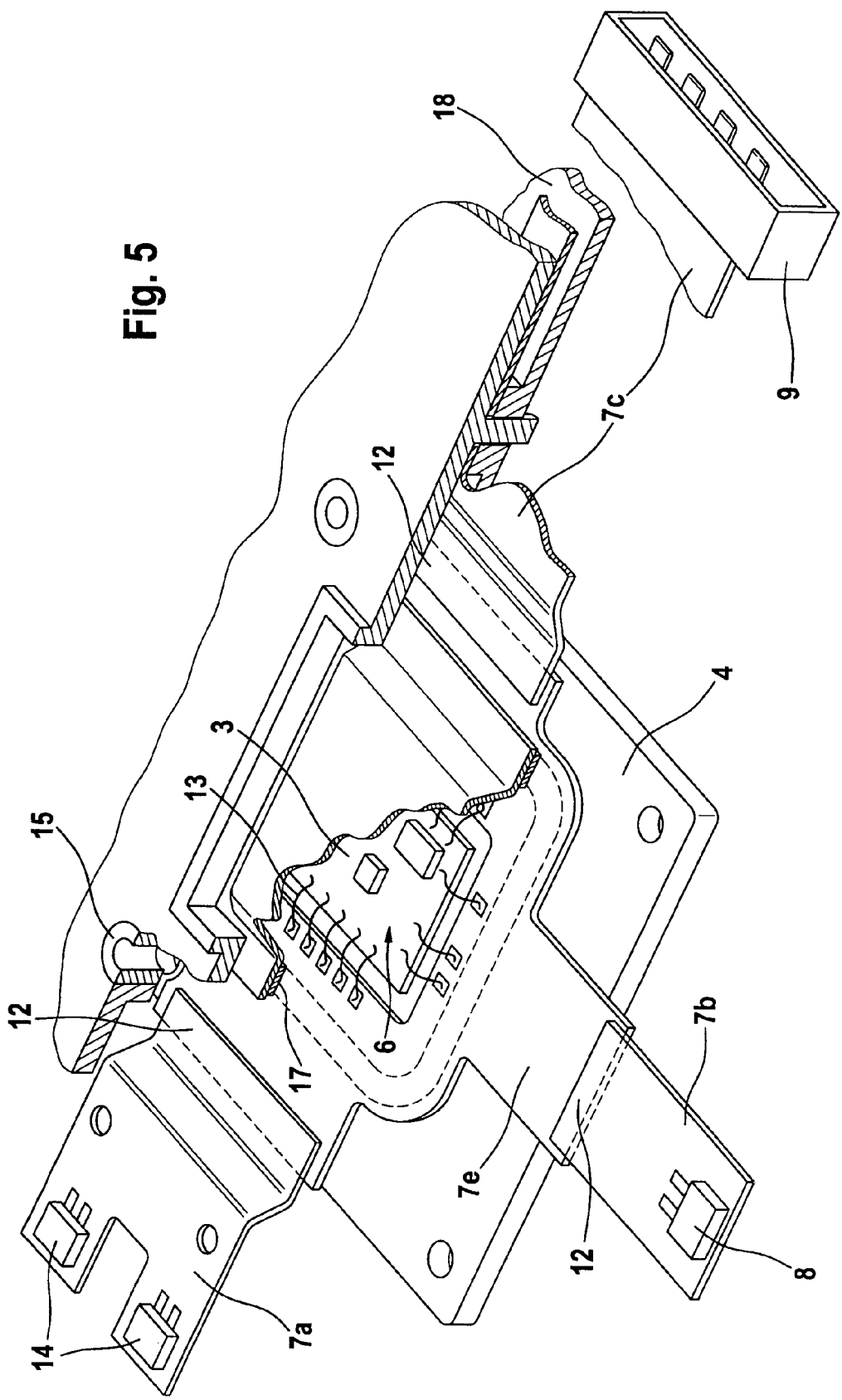
FIG. 5 shows a perspective detail of a third exemplary embodiment of a control module according to the present invention.

FIG. 3 shows the above-described embodiment in perspective view. FIG. 4 shows another exemplary embodiment of the present invention, which differs from the exemplary embodiment shown in FIG. 3 by the fact that not just one flexible printed circuit foil is provided for the electrical connection of circuit component 3 to the components of substrate part 10. Circuit component 3 is connected to components 8, 9, and 14 via a plurality of strip-shaped printed circuit foils 7a, 7b, 7c. FIG. 5 shows another embodiment. A closed printed circuit foil 7e is tightly glued onto first housing part 4 in the area of circuit component 3 and seal 17 surrounding this area and is contacted with circuit component 3 via bond wires 13. The track conductors of this printed circuit foil 7e form electrical connecting elements projecting from the housing for connecting further printed circuit foils 7a, 7b, 7c. Outside housing interior 6, at connecting points 12, printed circuit foil 7e is connected to printed circuit foils 7a, 7b, 7c, whose other ends are connected to components 8, 9, and 14. Individual components 14 may also be situated directly on the printed circuit foils; a printed circuit foil strip may also contact a plurality of components 14. In using this procedure, control unit 2 may be attached to substrate part 10 independently of printed circuit foils 7a, 7b, 7c; connecting points 12 may be produced after the assembly of the control unit and the printed circuit foils, by gluing or welding, for example.

Of course, the printed circuit foil strips may also be designed for directly contacting certain components omitting connecting points 12 and separate printed circuit foil strips having connecting points 12 may be used for other components. In this case, a combination of the embodiments shown in FIGS. 3 and 5 results. Since in the exemplary embodiment of FIGS. 4 and 5 a plurality of small printed circuit foil strips are used, the waste may be minimized, which results in considerable cost savings, which is the more pronounced the farther the sensors and connectors to be contacted are removed from circuit component 2. In addition, there is the possibility of completely prefabricating components 8, 14, or even connector 9 on a printed circuit foil strip and thus to achieve a particularly advantageous manufacturing process. Furthermore, replacing a printed circuit strip with one having a different geometry may represent a cost-effective, simple variant management. In manufacturing the control unit according to FIG. 5, printed circuit foil 7e may first be glued to the first housing part. Circuit 3 is then glued in and contacted with printed circuit foil 7e using bond wires 13. Second housing part 5 is then tightly glued to first housing part 4. For this purpose, a foil, provided with an adhesive on both sides, is applied with the aid of suitable centering holes or pins first on first housing part 4 and printed circuit foil 7e. Second housing part 5 is subsequently mounted. The pressing force should be such that a tight connection, from which printed circuit foil 7e is led out, is established between the two housing parts. This results in a compact and therefore easy-to-install unit, which is then connected to printed circuit foils 7a, 7b, 7c via connecting areas 12 and finally completed with substrate part 10.

Figure 6:
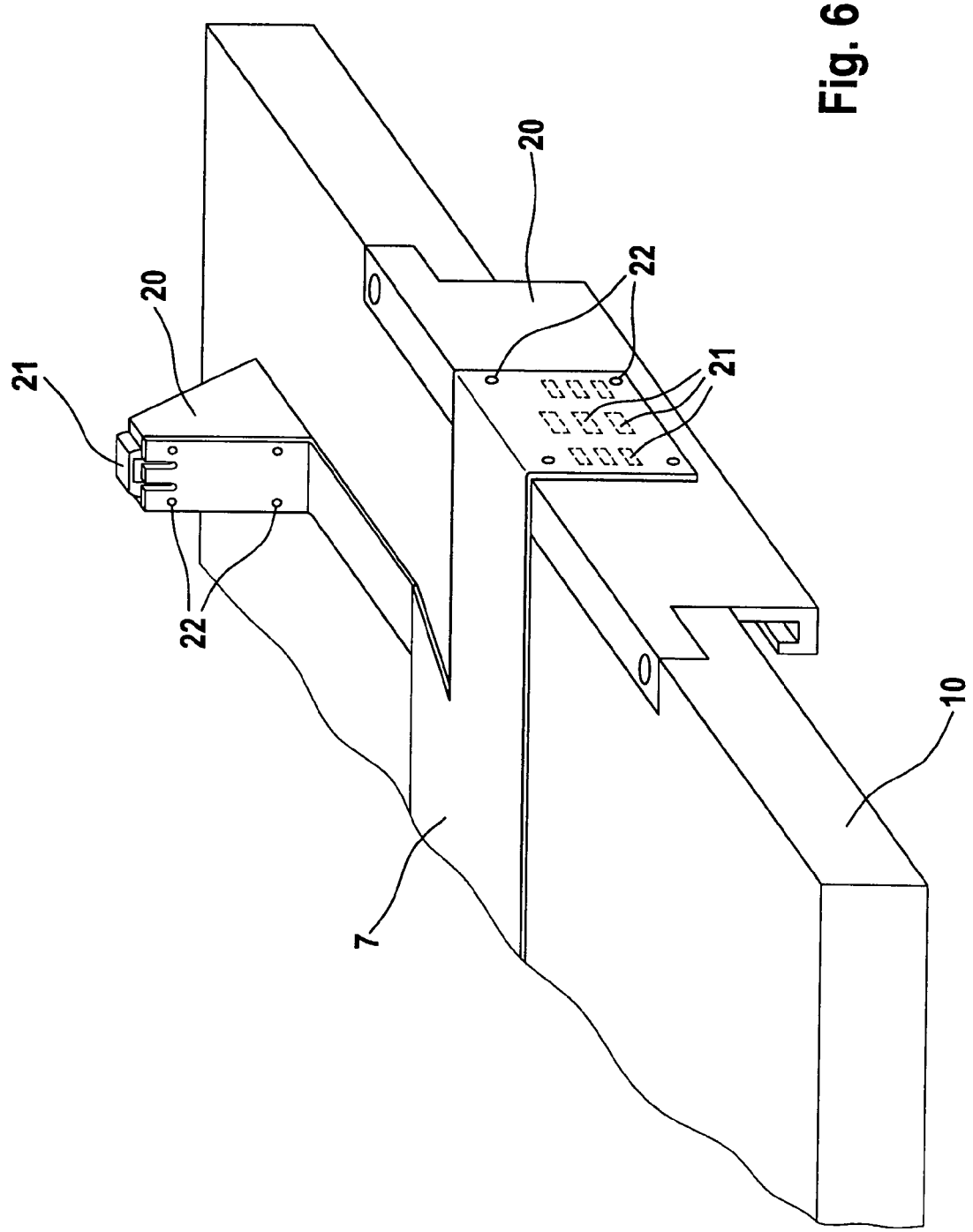
FIG. 6 shows a perspective detail of a control module.

It is furthermore possible to place individual sensor elements, standard components, or other components as ASICs (application-specific integrated circuits) on substrate part 10 of the control module. These may include rotational speed sensors, for example. An advantageous method for contacting flexible printed circuit foil 7 with the ASIC components is shown in FIG. 6. ASIC components 21 are placed into receptacles 20, which are located on substrate part 10. Receptacles 20 may also be designed in one piece with substrate part 10. Flexible printed circuit foil 7 is placed over the connecting pins of ASIC components 21 and contacted therewith by welding, soldering, or clamping. Positioning pins 22, situated on receptacles 20, are used for defining the position of the printed circuit foil.

LIST OF REFERENCE NUMERALS

1 control module
2\* control unit
3\* electronic circuit component
4 first housing part
5 second housing part
6 housing interior
7\* flexible printed circuit foil
7b, 7c, 7e printed circuit foils
8 sensor
9 connector part
10 substrate part
11 projection
12\* connecting area
13 bond wires
14 component
15 fastening elements
16 recess
17 seal
18 cover
19 bore holes
20 receptacles
21 ASIC components
22 positioning pins
23 heat-conducting housing part
24 contact area
25 projection

What is claimed is:

1. A control module for a transmission of a motor vehicle, comprising:
    a substrate part;
    a control unit situated on a substrate part, the control unit including a first housing part, a second housing part, and a housing interior situated between the first housing part and the second housing part;
    an electronic circuit component attached to the first housing part and situated in the housing interior; and
    at least one flexible printed circuit foil for electrically connecting the circuit component to electric components situated outside the housing interior, wherein: the first housing part of the control unit is situated flat on a contact area of the substrate part, and
    the second housing part is situated within the contact area on the first housing part.

2. The control module as recited in claim 1, wherein the control module is attachable to a transmission of the motor vehicle with the aid of at least one of the substrate part and the first housing part.

3. The control module as recited in claim 1, wherein the at least one flexible printed circuit foil is situated on projections of the substrate part.

4. The control module as recited in claim 1, wherein a plurality of flexible printed circuit foils, at least two different electric components being electrically connected to the circuit component, each with the aid of a flexible printed circuit foil.

5. The control module as recited in claim 1, wherein the at least one flexible printed circuit foil enters the housing interior between the first housing part (4) and the second housing part and is electrically connected there, at least indirectly, to the circuit component.

6. The control module as recited in claim 1, wherein the at least one flexible printed circuit foil is connected to electrical connecting elements outside the housing interior, the electrical connecting elements entering the housing interior between the first housing part and the second housing part and being electrically connected there, at least indirectly, to the circuit component.

7. The control module as recited in claim 6, wherein the connecting elements are formed by track conductors of at least one additional flexible printed circuit foil.

8. The control module as recited in claim 1, wherein a large-surface, flexible printed circuit foil surrounding the circuit component is tightly glued onto the first housing part, and is contacted with the circuit component via bond wires, and at least other flexible printed circuit foil strips are connected to the large-surface flexible printed circuit foil at connecting points outside the housing interior.

9. The control module as recited in claim 8, wherein the large-surface flexible printed circuit foil is sealingly led out of the housing interior between the first housing part and the second housing part with a seal positioned in-between.

10. The control module as recited in claim 1, wherein at least one electronic component is applied to a partial section of the at least one flexible printed circuit foil.

\* \* \* \* \*